US008204744B2

(12) United States Patent
Wu et al.

(10) Patent No.: US 8,204,744 B2
(45) Date of Patent: Jun. 19, 2012

(54) OPTIMIZATION OF MP3 AUDIO ENCODING BY SCALE FACTORS AND GLOBAL QUANTIZATION STEP SIZE

(75) Inventors: Guixing Wu, Waterloo (CA); En-hui Yang, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 696 days.

(21) Appl. No.: 12/325,409

(22) Filed: Dec. 1, 2008

(65) Prior Publication Data

US 2010/0138225 A1 Jun. 3, 2010

(51) Int. Cl.
*G10L 19/02* (2006.01)
*H03M 7/40* (2006.01)

(52) U.S. Cl. ..................... 704/230; 704/200.1; 704/501; 341/65

(58) Field of Classification Search ............... 704/200.1, 704/229, 230, 500, 501; 341/65
See application file for complete search history.

(56) References Cited

U.S. PATENT DOCUMENTS

| | | | | |
|---|---|---|---|---|
| 5,642,111 | A * | 6/1997 | Akagiri | 341/50 |
| 5,774,844 | A * | 6/1998 | Akagiri | 704/230 |
| 5,864,816 | A * | 1/1999 | Everett | 704/500 |
| 6,295,009 | B1 * | 9/2001 | Goto | 341/50 |
| 6,693,963 | B1 * | 2/2004 | Taniguchi | 375/240.11 |
| 6,950,794 | B1 * | 9/2005 | Subramaniam et al. | 704/200.1 |
| 7,328,152 | B2 * | 2/2008 | Yang et al. | 704/229 |
| 7,647,221 | B2 * | 1/2010 | Michener | 704/200.1 |
| 7,788,090 | B2 * | 8/2010 | Van De Par et al. | 704/200.1 |
| 7,945,448 | B2 * | 5/2011 | Wang et al. | 704/500 |
| 8,019,601 | B2 * | 9/2011 | Eguchi | 704/230 |
| 2001/0047256 | A1 * | 11/2001 | Tsurushima et al. | 704/200 |
| 2007/0168197 | A1 * | 7/2007 | Vasilache | 704/503 |
| 2009/0207937 | A1 * | 8/2009 | Yang et al. | 375/296 |
| 2010/0217605 | A1 * | 8/2010 | Wu et al. | 704/500 |
| 2011/0125506 | A1 * | 5/2011 | Wu et al. | 704/500 |

FOREIGN PATENT DOCUMENTS

EP 1850327 10/2007

OTHER PUBLICATIONS

Jingming Xu and En-hui Yang, Rate-distortion Optimization for MP3 Audio Coding with Complete Decoder Compatibility, 2005 IEEE 7th Workshop on Multimedia Signal Processing, Oct. 2005, pp. 1-4, ISBN: 0/7803-9289-2 Digital Object Identifier: 10.1109/MMSP.2005.248559, Shanghai.
C. Bauer and M. Vinton, Joint optimization of scale factors and Huffman code books for MPEG-4 AAC, IEEE Transactions on Signal Processing, Jan. 2006, pp. 177-189, vol. 54 Issue: 1, ISSN: 1053-587X, Digital Object Identifier: 10.1109/TSP.2005.861090.

(Continued)

*Primary Examiner* — Martin Lerner
(74) *Attorney, Agent, or Firm* — Rowand Intellectual Property Law

(57) ABSTRACT

An iterative rate-distortion optimization algorithm for MPEG I/II Layer-3 (MP3) encoding based on the method of Lagrangian multipliers. Generally, an iterative method is performed such that a global quantization step size is determined while scale factors are fixed, and thereafter the scale factors are determined while the global quantization step size is fixed. This is repeated until a calculated rate-distortion cost is within a predetermined threshold. The methods are demonstrated to be computationally efficient and the resulting bit stream is fully standard compatible.

15 Claims, 7 Drawing Sheets

OTHER PUBLICATIONS

A. Aggarwal, S.L. Regunathan, and K. Rose, Near-optimal selection of encoding parameters for audio coding, 2001 IEEE International Conference on Acoustics, Speech, and Signal Processing, Proceedings (ICASSP '01), May 7-11, 2001, pp. 3269-3272, vol. 5, ISBN: 0-7803-7041-4, Digital Object Identifier: 10.1109/ ICASSP.2001. 940356, Salt Lake City, Utah.

Cheng-Han Yang and Hsueh-Ming Hang, Cascaded trellis-based rate-distortion control algorithm for MPEG-4 advanced audio coding, IEEE Transactions on Audio, Speech, and Language Processing, May 2006, pp. 998-1007, vol. 14 , Issue 3, ISSN: 1558-7916, Digital Object Identifier: 10.1109/TSA.2005.857789.

Bosi M. et al., "ISO/IEC MPEG-2 Advanced Audio Coding", Journal of the Audio Engineering Society, Audio Engineering Society, New York, NY, USA, vol. 45, No. 10, Oct. 1, 1997, pp. 789-812.

* cited by examiner

140

150

160

170

OPTIMIZATION OF MP3 AUDIO ENCODING BY SCALE FACTORS AND GLOBAL QUANTIZATION STEP SIZE

FIELD

Example embodiments herein relate to audio signal encoding, and in particular to rate-distortion optimization for MP3 encoding.

BACKGROUND

Many compression standards have been developed and evolved for the efficient use of storage and/or transmission resources. Among these standards is the audio coding scheme MPEG I/II Layer-3 (conventionally referred to as “MP3”), which has been a popular audio coding method since its inception in 1991. MP3 has greatly facilitated the storage and access of audio files. MP3 is now widely used in the Internet, portable audio devices and wireless communications.

An example MP3 encoder is LAME, which refers to “LAME Ain’t an Mp3 Encoder”, as is known in the art. Another MP3 encoder is ISO reference codec, which is based on the ISO standard. Generally, such MP3 encoders include use of two nested loop search (TNLS) algorithms, which are computationally complex and may not be guaranteed to converge. These encoders may be configured or operated to provide for additional functionality and customization.

Generally, although the encoding algorithm is not standardized in MP3, the basic structure and syntax-related tools are fixed so that the MP3 encoded/compressed bitstreams can be correctly decoded by any standard compatible decoder. However, there may be opportunities to manipulate the encoding algorithm while maintaining full decoder compatibility.

BRIEF DESCRIPTION OF THE DRAWINGS

Reference will now be made, by way of example, to the accompanying drawings which show example embodiments of the present application, and in which.

DESCRIPTION OF EXAMPLE EMBODIMENTS

Figure 1:
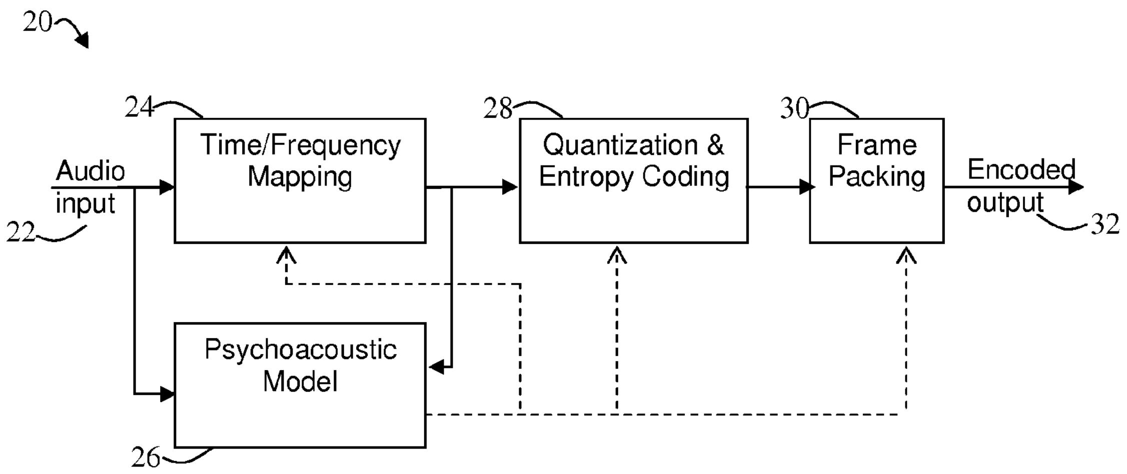
FIG. 1 shows an MP3 encoding process to which example embodiments may be applied.

It would be advantageous to provide an iterative optimization algorithm to jointly optimize quantized coefficient sequences, quantization factors, Huffman coding and Huffman coding region partition for MP3 encoding.

It would be advantageous to provide for efficient optimization of quantization factors.

In one aspect, the present application provides a method for optimizing audio encoding of a source sequence, the encoding being dependent on quantization factors, the quantization factors including a global quantization step size and scale factors. The method includes defining a cost function of the encoding of the source sequence, the cost function being dependent on the quantization factors. The method includes initializing fixed values of the scale factors; and determining values of the quantization factors which minimize the cost function by iteratively performing:

determining, for the fixed values of the scale factors, a value of the global quantization step size which minimizes the cost function, fixing the determined value of the global quantization step size and determining values of scale factors which minimize the cost function, and fixing the determined values of the scale factors, and determining whether the cost function is below a predetermined threshold, and if so ending the iteratively performing.

In another aspect, the present application provides a method for optimizing audio encoding of a source sequence based on minimizing of a cost function, the cost function being a function of quantization distortion and encoding bit rate, the cost function including λ as a function that represents the tradeoff of encoding bit rate for quantization distortion, the method comprising calculating λ as the function $$\lambda_{final}^{R} = \frac{c_1 \ln 10}{10M} \times 10^{(c_2 PE - c_3 R)/M}$$

wherein PE is Perceptual Entropy of an encoded frame, R is an encoding bit rate, M is the number of audio samples to be encoded, and $c_1$, $c_2$ and $c_3$ are constants; and calculating the cost function using λ.

In another aspect, the present application provides an encoder for optimizing audio encoding of a source sequence, the audio encoding being dependent on quantization factors, the quantization factors including a global quantization step size and scale factors. The encoder includes a controller, a memory accessible by the controller, a cost function of an encoding of the source sequence stored in memory, the cost function being dependent on the quantization factors; and a predetermined threshold of the cost function stored in the memory. The controller is configured to access the cost function and predetermined threshold from memory, initialize fixed values of the scale factors, and determine values of the quantization factors which minimize the cost function by iteratively performing:

- determining, for the fixed values of the scale factors, a value of the global quantization step size which minimizes the cost function,
- fixing the determined value of the global quantization step size and determining values of scale factors which minimize the cost function, and fixing the determined values of the scale factors, and
- determining whether the cost function is below the predetermined threshold, and if so ending the iteratively performing.

Reference is now made to FIG. 1, which shows an MP3 encoding process 20 to which example embodiments may be applied. Generally, the MP3 encoding process 20 receives digital audio input 22 and produces a compressed or encoded output 32 in the form of a bitstream for storage and transmission. The encoding process 20 may for example be implemented by an encoder such as a suitably configured computing device. In FIG. 1, continuous lines denote the time or spectral domain signal flow, and dash lines denote the control information flow. As shown, the encoding process 20 includes audio input 22 for input to a time/frequency (T/F) mapping module 24 and a psychoacoustic model module 26. Also shown are a quantization and entropy coding module 28 and a frame packing module 30. The encoding process 20 results in an encoded output 32 of the audio input 22, for example for sending to a decoder for subsequent decoding.

The audio input 22 (in time domain) are first input into the T/F mapping module 24, which converts the audio input 22 into spectral coefficients. The T/F mapping module 24 is composed of three steps: pseudo-quadrature mirror filter (PQMF), windowing and modified discrete cosine transform (MDCT), and aliasing reduction. The PQMF filterbank splits a so-called granule (in MPEG I and II layer 3 each audio frame contains 2 and 1 granules respectively) of 576 input audio samples into 32 equally spaced subbands, where each subband has 18 time domain audio samples. The 18 time domain audio samples in each subband are then combined with their counterpart of the next frame, and processed by a sine-type window based on psychoacoustic modeling decisions. A long window, which covers a whole length of 36, addresses stationary audio parts. Long windowing with MDCT afterwards ensures a high frequency resolution, but also causes quantization errors spreading over the 1152 time-samples in the process of quantization. A short window is used to reduce the temporal noise to spread for the signals containing transients/attacks. In the short window, audio signals with a length of 36 are divided into 3 equal sub-blocks. In order to ensure a smooth transition from a long window to a short window and vice versa, two transition windows, long-short (start) and short-long (stop), which have the same size as a long window, are employed.

The psychoacoustic model module 26 is generally used to generate control information for the T/F mapping module 24, and for the quantization and entropy coding module 28. Based on the control information from the psychoacoustic model module 26, the spectral coefficients which are output from the T/F mapping module 24 are received by the quantization and entropy coding module 28, and are quantized and entropy coded. Finally these compressed bits streams are packed up along with format information, control information and other auxiliary data in MP3 frames, and output as the encoded output 32.

The MP3 syntax leaves the selection of quantization step sizes and Huffman codebooks to each encoder or encoding algorithm, which provides opportunity to apply rate-distortion consideration. A conventional MP3 encoding algorithm is now be described as follows, which employs a "hard decision quantization", a two nested loop search (TNLS) algorithm, and fixed or static Huffman codebooks.

The MP3 quantization and entropy coding module 28 first subdivides an entire frame of 576 spectral coefficients into 21 or 12 scale factor bands for a long window block (including long-short window and short-long window) or a short window block respectively. Each coefficient xri, i=0 to 575, is quantized by the following non-uniform quantizer:

$$y_i = n\text{int}\left[\left(\frac{|xr_i|}{\left(\sqrt[4]{2}\right)^{\text{global\_gain}-210-\text{scale\_factor}[sb]}}\right)^{0.75} - 0.0946\right] \tag{2.1}$$

where $y_i$ denotes the quantized index, nint denotes the nearest non-negative integer, global_gain is a global quantization step size which determines the overall quantization step size for the entire frame, and scale_factor[sb] is used to determine the actual quantization step size for scale factor band sb where the spectral coefficient $xr_i$ lies (sb=0 to 11 for short blocks, sb=0 to 20 for other blocks) to make the perceptually weighted quantization noise as small as possible. The formulaic determination of $y_i$ as in (2.1) may be referred to as "hard decision quantization".

The scale_factor[sb] is expressed as $$\text{scale\_factor}[sb]=2\cdot(\text{scalefac}[\text{sub\_block}][sb]+\text{preflag}\cdot\text{pretab}[sb])\times(1+\text{scalefac\_scale})+8\times\text{sub\_block\_gain}[\text{sub\_block}]. \tag{2.2}$$

Generally, each of the parameters listed in (2.2) may be referred to as a "scale factor", and all of which may be collectively referred to herein as "scale factors", as appropriate. global_gain and the scale factors may collectively be referred to herein as "quantization factors".

In (2.2), sub_block is only used for short windows, and it refers to one of the 3 sub-blocks for a short window. scalefac [sub_block][sb] is a scale factor parameter for scale factor band sb to color the quantization noise. scalefac[sub_block] [sb] are variable length transmitted according to scalefac_compress which occupies 4 bits (MPEG-1) or 9 bits (MPEG-2) in the side information of MP3 encoded frames. preflag is a shortcut for additional high frequency amplification of the quantized values. If preflag is set, the values of a fixed table pretab[sb] are added to the scale factors. preflag is never used in short windows (for the purposes of the standard). sub block_gain[sub_block] is the gain offset for the short window. scalefac_scale is a one-bit parameter used to control the quantization step size.

The quantized spectral coefficients are then encoded by static Huffman coding, which utilizes 34 fixed Huffman codebooks. To achieve greater coding efficiency, MP3 subdivides the entire quantized spectrum into three regions. Each region is coded with a different set of Huffman codebooks that best match the statistics of that region. Specifically, at high frequencies, MP3 identifies a region of "all zeros". The size of this region can be deduced from the sizes of the other two regions, and the coefficients in this region don't need to be coded. The only restriction is that it must contain an even number of zeros since the other two regions group their values in 2- or 4-tuples. The second region, called "count 1" region, contains a series of contiguous values consisting only of −1, 0, +1 just before the "zero" region, and is encoded in 4-tuples by Huffman codebook 32 or 33. Finally the low frequency region, called "big value" region, covers the remaining coefficients which are encoded in pairs. This region is further subdivided into 3 (for long window) or 2 (for short, long-short and short-long window) parts with each covered by a distinct Huffman codebook.

To minimize the quantization noise, a noise shaping method may be applied to find the proper global quantization step size global_gain and scale factors before the actual quantization. Some conventional algorithms use the TNLS algorithm to jointly control the bit rate and distortion. The TNLS algorithm consists of an inner (rate control) loop and an outer (noise control) loop. The task of the inner loop is to change the global quantization step size global_gain such that the given spectral data can just be encoded with the number of bits available. If the number of bits resulting from Huffman coding exceeds this number, the global_gain can be increased to result in a larger quantization step size, leading to smaller quantized values. This operation is repeated until the resulting bit demand for Huffman coding is small enough. The TNLS algorithm may require quantization step sizes so small to obtain the best perceptual quality. On the other hand, it has to increase to the quantization step sizes to enable coding at the required bit rate. These two requirements are conflicting. Therefore, this conventional algorithm does not guarantee to converge.

In some example embodiments, soft decision quantization, instead of the hard decision quantization, is applied, and the corresponding purpose of quantization and entropy coding in MP3 encoding is to achieve the minimum perceptual distortion for a given encoding bit rate by solving, mathematically, the following minimization problem:

$$\begin{cases} \min_{y,q,p,h} D_w(xr, rxr), \text{ subject to} \\ R(q) + R(y, P, H) \leq R_1 \end{cases} \tag{3.1}$$

where xr is the original spectral signal, rxr is the reconstructed signal obtained from the quantized spectral coefficients y, P and H represent Huffman codebook region partition and Huffman codebooks selection respectively, q denotes the quantization factors including global_gain and scale factors, R(q) and R(y, P, H) are the bit rates to encode q and the quantized spectral coefficients y respectively, $R_1$ is the rate constraint, and $D_w$ (xr, rxr) denotes the weighted distortion measure between xr and rxr. Note that here y is not calculated according to (2.1) anymore; instead, it is treated as a variable in a cost function involving the distortion and rates, and has to be determined jointly along with q, P, and H. Average noise-to-mask ratio (ANMR) is used as the distortion measure. The noise-to-mask ratio (NMR), the ratio of the quantization noise to the masking threshold, is a widely used objective measure for the evaluation of an audio signal. ANMR is expressed as $$ANMR = \frac{1}{N}\sum_{sb=1}^{N} w[sb] \cdot d[sb] \tag{3.2}$$

where N is the number of scale factor bands, w[sb] is the inverse of the masking threshold for scale factor band sb, and d[sb] is the quantization distortion, mean squared quantization error for scale factor band sb.

The above constrained optimization problem could be converted into the following minimization problem:

$$\min_{y,q,P,H} J_\lambda(y,q,P,H) = D_w(xr,rxr) + \lambda \cdot (R(q) + R(y,P,H)) \tag{3.3}$$

where λ is a fixed parameter that represents the tradeoff of rate for distortion, and $J_\lambda$ is referred to as the "Lagrangian cost".

Figure 2:
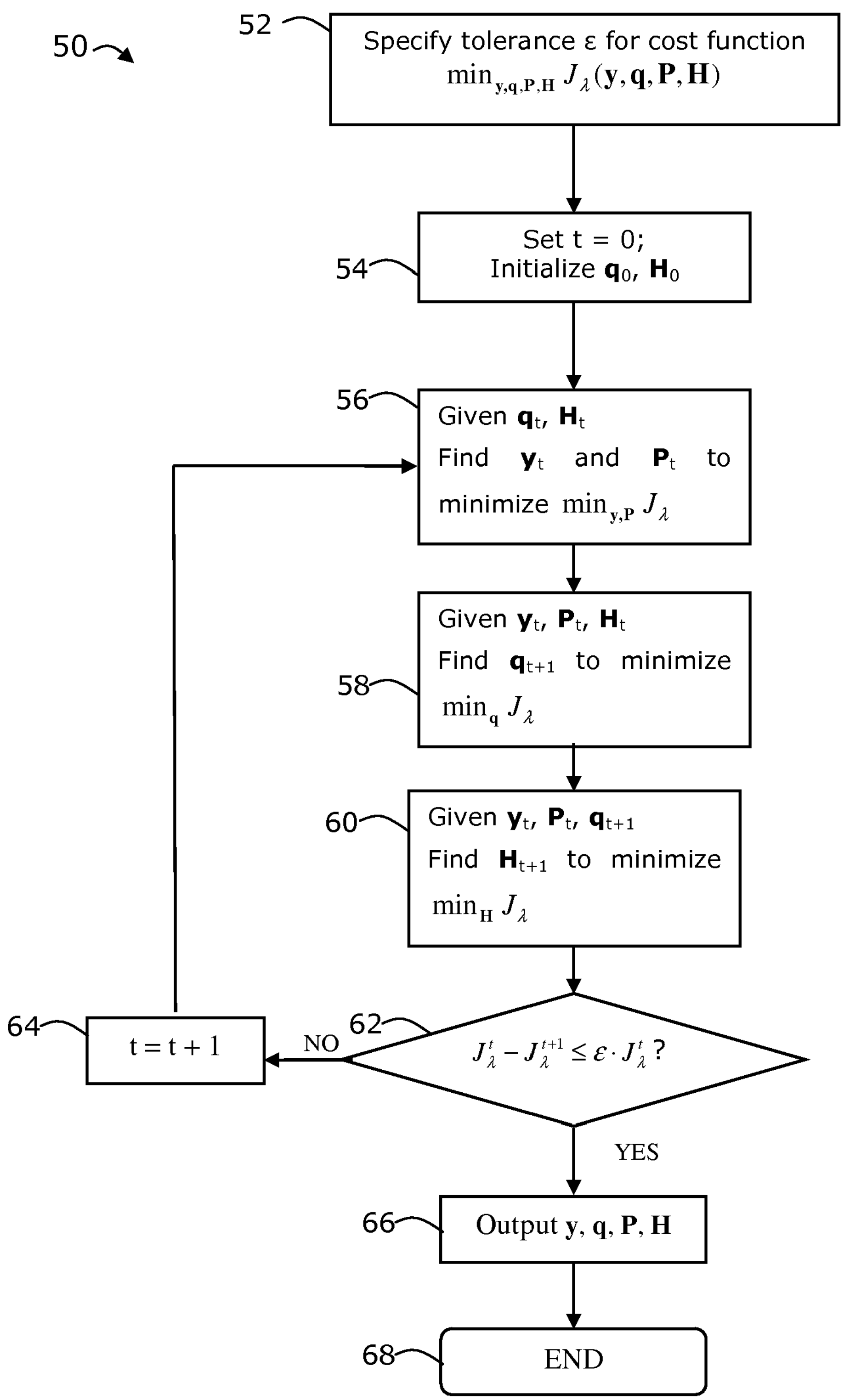
FIG. 2 shows a flow diagram of an optimization process in accordance with an example embodiment.

Reference is now made to FIG. 2, which shows a flow diagram of an optimization process 50 in accordance with an example embodiment. The exact order of steps may vary from those shown in FIG. 2 in different applications and embodiments. It can also be appreciated that more or less steps may be required in some example embodiments, as appropriate. To find an optimum $J_\lambda$, the parameters y, q, P and H are jointly optimized. The general framework for the process 50 has been outlined previously in Xu and E.-h. Yang, "Rate-distortion optimization for MP3 audio coding with complete decoder compatibility," in *Proc.* 2005 *IECE Workshop on Multimedia Signal Processing*, October 2005, the contents of which are herein incorporated by reference. Generally, the process 50 selects the quantized spectral coefficients y and Huffman codebook region division P, quantization factors q and Huffman codebook region selection H alternatively to minimize the Lagrangian cost J. The iterative searching for the parameters may be referred to as "soft-decision quantization" (rather than the formulaic "hard-decision quantization" of (2.1), described above).

Referring still to FIG. 2, the iterative algorithm of the process 50 can be described as follows. At step 52, specify a tolerance ϵ as the convergence criterion for the Lagrangian cost J. At step 54, initialize a set of quantization factors $q_0$ from the given frame of spectral domain coefficients xr with a Huffman codebooks selection mode $H_0$; and set t=0.

At step 56, $q_t$ and $H_t$ are fixed or given for any t≧0. Find the optimal quantized spectral coefficients $y_t$ and Huffman codebook region division $P_t$ by soft decision quantization, where $y_t$ and $P_t$ achieve the minimum $$\min_{y,P} J_\lambda = D_w(xr; Q^{-1}(q,y)) + \lambda \cdot (R(q_t) + R(y,P,H_t)) \tag{3.4}$$

where the inverse quantization function $Q^{-1}(q,y)$ is used to generate the reconstructed signal rxr. Denote $J_\lambda(y_t, q_t, P_t, H_t)$ by $J_\lambda^t$.

At step 58, given $y_t$, $P_t$ and $H_t$, update $q_t$ to $q_{t+1}$ so that $q_{t+1}$ achieves the minimum $$\min_q J_\lambda = D_w(xr; Q^{-1}(q,y)) + \lambda \cdot (R(q) \tag{3.5}$$

At step 60, given $y_t$, $P_t$ and $q_{t+1}$, update $H_t$ to $H_{t+1}$ so that $H_{t+1}$ achieves the minimum $$\min_H R(y_t, P_{t+1}, H_t) \tag{3.6}$$

At step 62, query whether $J_\lambda^t - J_\lambda^{t+1} \leqq \epsilon \cdot J_{80}^t$. If so, the optimization process 50 proceeds to step 66 and outputs the final y, q, P and H and ends at step 68. If not, proceed to step 64 wherein t=t+1, and repeat steps 56, 58 and 60 for t=0, 1, 2, . . . until $J_\lambda^t - J_\lambda^{t+1} \leqq \epsilon \cdot J_\lambda^t$. Since the Lagrangian cost function may be non-increasing at each step, the convergence is guaranteed. The final y, q, P and H may thereafter be provided for MP3 coding of xr.

Figure 3:
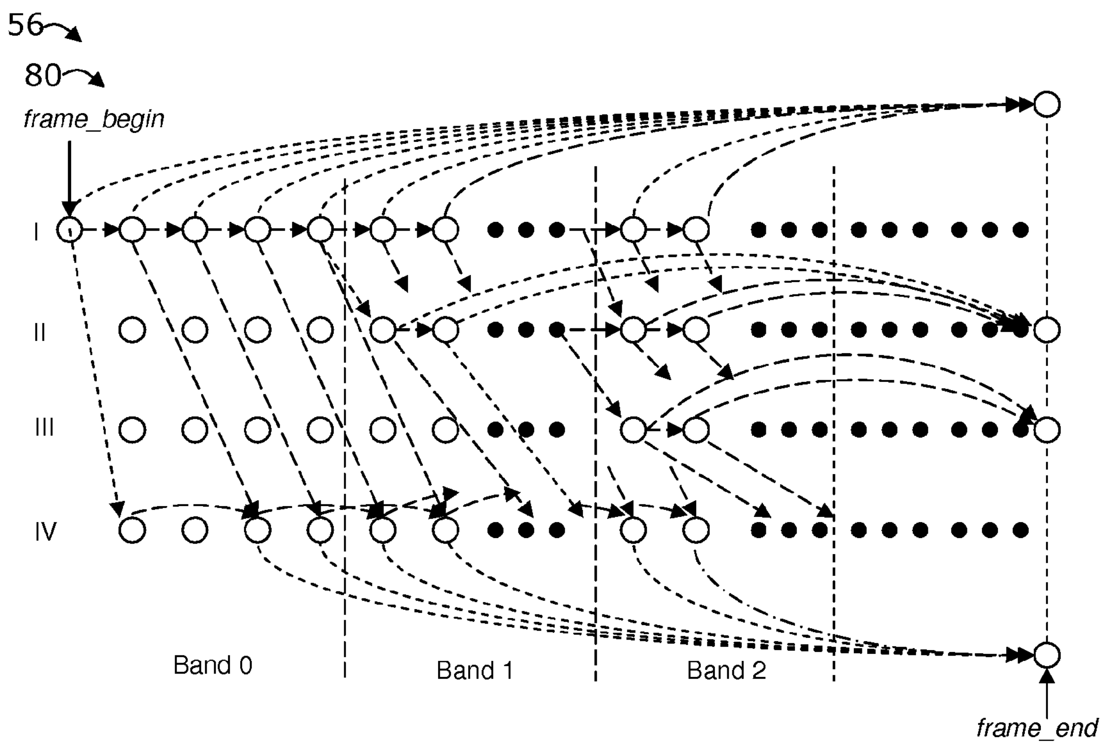
FIG. 3 shows a graph of an optimal path search algorithm for use in the process of FIG. 2.
Figure 4:
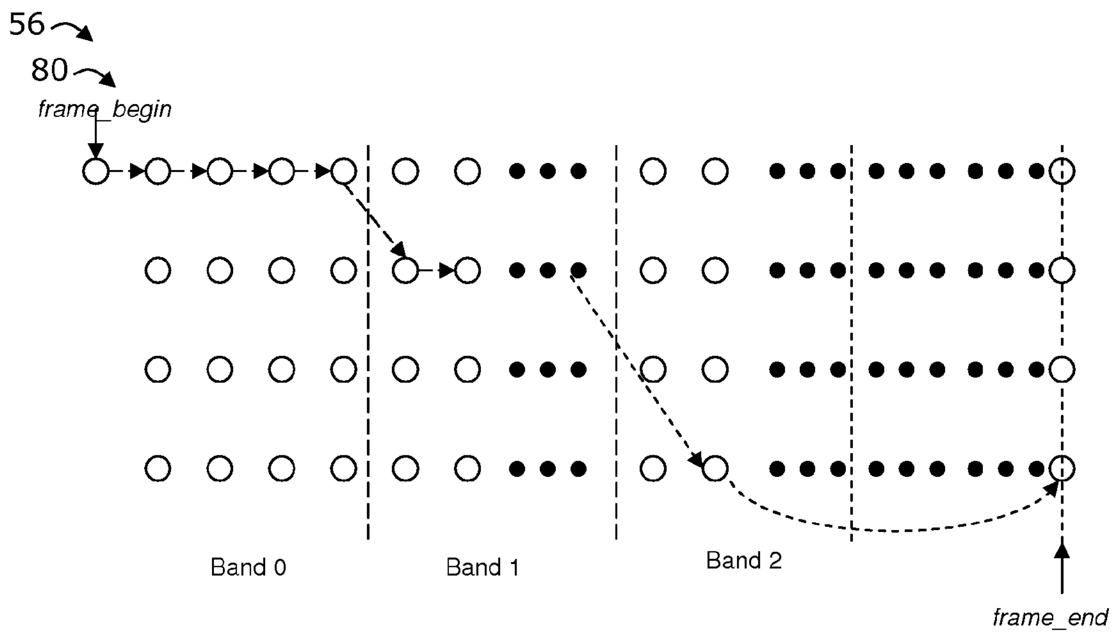
FIG. 4 shows the graph of FIG. 3, illustrating an optimal path.

Referring still to FIG. 2, an example embodiment of step 56 will now be described in greater detail, with reference now to FIGS. 3 and 4. FIG. 3 shows a graph 80 of an optimal path search algorithm for use in the process of FIG. 2; while FIG. 4 shows an optimal path of the graph 80.

Without being limiting, consider for example the long window case. The graph 80 is defined with 4 layers (shown as I, II, III, and IV) and 288 nodes in each layer as shown in FIG. 3. The 4 layers correspond to the three divisions of the big_value region and the count_1 region. Each state $S_{L,i}$ (L=I, . . . , IV, 0≦I<288) in layer L stands for two neighboring coefficients $xr_{2i}$ and $xr_{2i+1}$ to be quantized, since Huffman coding is always applied on 2-(for layer I, II, III) or 4-(for layers IV) tuples. Two special states, frame_begin and frame_end, denote the start and end of the frame respectively. Connection between any two states denotes a Huffman codebook region division decision pair: state $S_{L,i}$ may have incoming connections from states $S_{M,j}$(M=1, . . . , L; j=i−2 if L=IV, and j=i−1 otherwise), each of which represents the decision of assigning node i, i.e., coefficients $xr_{2i}$ and $xr_{2i+1}$ to the Huffman codebook region denoted by layer L. Note that not all the states and paths are compatible with the standard and the following syntax constraints should be observed for the construction of the graph 80:

a) States of scale factor band 0 in layers II and III, states of scale factor band 1 in layer III, and the second state in layer IV are illegitimate, and thus don't have any incoming and outgoing connections;

b) States after scale factor band 15 in Layer I are not allowed;

c) A graph path cannot transverse more than 8 scale factor bands in layer II;

d) The connections among layers I, II and III can only occur at the scale factor band boundaries, and the frame_begin state has only outgoing connections to states $S_{I,0}$ and $S_{IV,0}$ and frame_end; and e) The frame_end state has incoming connections from all legitimate states, with each connection from non-trailing state $S_{L,i}$ ($0 \leqq i < 287$) representing the decision of assigning the coefficients after node i to the zero region, that is, dropping that part of spectrum without Huffman encoding and transmission.

Assign to each connection from previous states (no matter which layer they lie in) to state $S_{L,i}$ ($0 \leqq i < 288$) a cost which is defined as the minimum incremental Lagrangian cost of quantizing and Huffman encoding the coefficients of state $S_{L,i}$ (or states $S_{L,i-1}$ and $S_{L,i}$ if L=IV) by using the Huffman codebook selected for layer L. Specifically, this minimum incremental cost is equal to $$\min_{y_{2i-k}, \ldots, y_{2i}} \sum_{j=2i-k}^{2i} D_w(xr_j, Q^{-1}(q_j, y_j)) + \lambda \cdot r_L(y_{2i-k}, \ldots y_{2i}) \tag{3.7}$$

where k=3 if L=IV, and k=1 otherwise, $y_j$, j=2i-k, . . . 2i, is the jth quantized coefficient, $q_j$ is the corresponding scale factor for $y_j$, and $r_L(\ldots)$ denotes the codeword length by using the Huffman codebook selected for layer L. Similarly, for the connection from state $S_{L,i}$ ($0 \leqq i < 287$) to the frame_end state, its cost is defined as $$\sum_{j=2i-k}^{576} D_w(xr_j, Q^{-1}(q_j, 0)) + \lambda \cdot 0 = \sum_{j=2i-k}^{576} D_w(xr_j, Q^{-1}(q_j, 0)) \tag{3.8}$$

No cost is assigned to the connections from trailing state $S_{L,288}$ to the frame_end state.

With the above definitions, every sequence of connections from the frame_begin state to the frame_end state corresponds to a Huffman codebook region division of the entire frame with a Lagrangian cost. For example, the sequence of connection in FIG. 4 assigns scale factor band 0 and 1 to the fist two subdivisions of the big_value region respectively, the next 4 coefficients to the count_1 region, and the rest to the zero region. On the other hand, any Huffman codebook region division of the entire frame that is compatible with the standard can be represented by a sequence of connections from the frame_begin to the frame_end state in the graph 80. Hence the optimal path from the frame_begin state to the frame_begin state, together with quantized coefficients along each connection that give the minimum cost defined by (3.7), achieves the minimum in step 56 (FIG. 2) for any given q and H.

An elaborate step-by-step description of the path searching algorithm is described as follows, referring still to FIGS. 3 and 4. As an initialization, the algorithm preselects and stores the best quantized coefficients based on minimizing the Lagrangian cost of (3.7) for each legitimate state $S_{L,i_t}$ and sets their associated cost as the cost of each connection to that state. The algorithm also recursively precalculates, for each state, the distortion/cost resulting from ending the frame at that state, i.e., the cost of its connection to the state frame_end. The algorithm begins with the state frame_begin by storing the cost of dropping the entire frame in $J_{frame\_begin}$. Then, one proceeds to state $S_{L,0}$ (L=I, . . . , IV), among which only states $S_{I,0}$ and $S_{IV,0}$ have incoming connections from the state frame_begin. The cost of each state is set to the cost of corresponding incoming connection, and added with the cost of dropping the remaining coefficients to get $J_{I,0}$ and $J_{IV,0}$, respectively. Proceeding to state $S_{L,1}$ (L=I, . . . , IV), only states $S_{L,1}$ has an incoming connection from states $S_{I,0}$. Set its cost to the sum of the costs of state $S_{I,0}$ and the connection between $S_{I,0}$ and $S_{I,1}$, and add it with the cost of dropping the remaining coefficients to get $J_{I,1}$. Next, consider states $S_{L,2}$ (L=I, . . . , IV), it may be observed that $S_{IV,2}$ has two incoming connections from $S_{IV,0}$ and $S_{I,0}$ respectively. Here the connection from the state with less cost is chosen, and the costs of $S_{IV,2}$ and $J_{IV,2}$ are computed by adding it with corresponding incremental connection costs, respectively. Following the above cost computation rule, process all legitimate states: for each state $S_{L,i}$, the best incoming connection is selected such that the accumulated cost (from frame_begin to $S_{L,i}$) can be minimized. Store this connection selection decision at that state, set the cost of $S_{L,i}$ to the accumulated cost, and then sum it with the cost of dropping the remaining coefficients to get $J_{L,i}$.

Referring now to FIG. 4, after traversing all the legitimate states, the path cost information, $J_{L,i}$, L=I, . . . , IV, $0 \leqq i < 288$, is available. Obtain the minimum path cost $J_{min} = \min_{L,i} J_{L,i}$. By backtracking the path which gives $J_{min}$ with the help of the stored information in each state, the optimal quantized spectral coefficients y and region division P that solve the problem (3.4) may be obtained.

In a similar manner as described above, a three-layer graph could be constructed for other three window cases.

Figure 5:
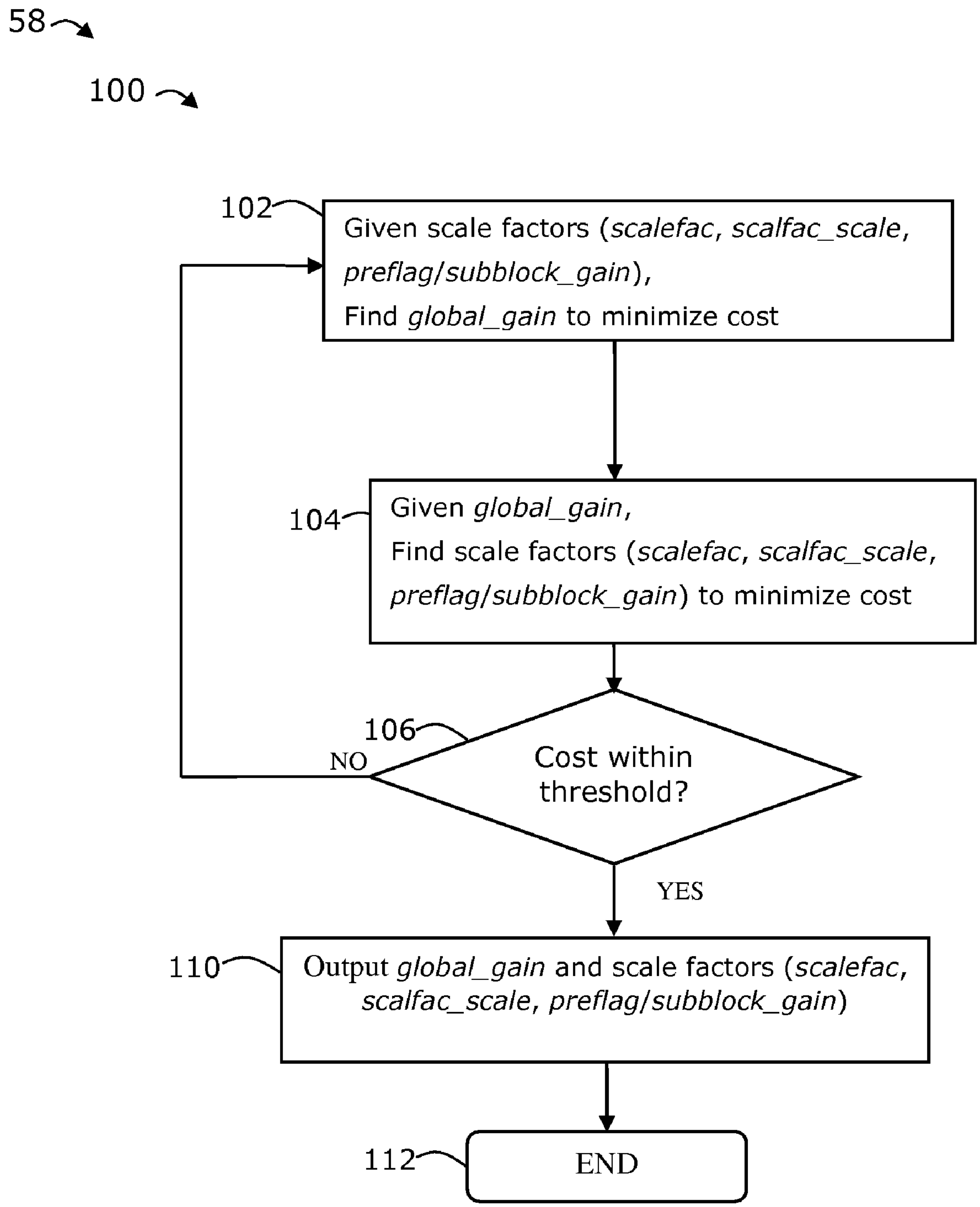
FIG. 5 shows a flow diagram of a process to be used in the optimization process of FIG. 2.

Referring to FIG. 2, step 58 will now be described in greater detail, with reference now to FIG. 5. FIG. 5 shows an example embodiment of a process 100 to be used in step 58 of FIG. 2. Step 58 generally determines the quantization factors q (i.e., scale factors and global_gain) that minimize the combined cost of weighted distortion and bit rate for encoding or transmittal. Given the nonuniform quantizer and nonlinear bit rate for quantization factors in the standard, there is no direct formula to calculate the optimal quantization factors. Direct search through all combinations of global_gain, scalefac_compress, scalefac, scalfac_scale, and subblock_gain (for short windows) or preflag (for other windows) may be computationally complex. Take an MPEG-1 encoded long-block frame as an example. There are 256 different cases for global_gain. scalefac_compress, preflag and scalfac_scale have 16, 2 and 2 different cases respectively. There are 256×16×2×2=16384 different combinations to find the minimum combined cost. In some example embodiments, to reduce the computational complexity, the method 100 includes the following alternating minimization procedure to minimize the combined cost. Generally, at step 102 global_gain is determined while the scale factors are fixed, and at step 104 the scale factors are determined while global_gain is fixed. This is repeated iteratively until the calculated rate-distortion cost is within a predetermined threshold.

At step 102, update global_gain when scalefac, scalfac_scale and subblock_gain (for short windows) or preflag (for other windows) are fixed. In this case, the bit rate for the transmission of scale factors is fixed. Therefore, at this stage only the encoding distortion is minimized, while rate is not considered. The weighted distortion for scale factor band sb is $$d_w[sb] = w[sb] \cdot \sum_{i=l[sb]}^{l[sb+1]-1} [xr_i - y_i^{4/3} 2^{s(sb)/4}]^2 \tag{3.9}$$

where s[sb]=global_gain−210−scale_factor[sb], I[sb] and I[sb+1]−1 are the start and end positions for scale factor band sb respectively, w[sb] is the inverse of the masking threshold for scale factor band sb. The total average weighted distortion $D_w$ for an encoded frame could be expressed as $$D_w = \frac{1}{N}\sum_{sb=1}^{N} d_w[sb] = \frac{1}{N}\sum_{sb=1}^{N} w[sb]\cdot\sum_{i=l[sb]}^{l[sb+1]-1}\left[xr_i - y_i^{4/3}2^{s(sb)/4}\right]^2 \quad (3.10)$$

Differentially calculate the distortion based on encoding with respect to global_gain to minimize the distortion. Let $$\frac{\partial D}{\partial \text{global\_gain}} = 0,$$

which leads to $$\text{global\_gain} = \frac{4}{\log_{10}2}\log_{10}\frac{\sum_{sb=1}^{N} b[sb]}{\sum_{sb=1}^{N} a[sb]} + 210 \quad (3.11)$$

where $$b[sb] = 2^{-scale\_factor[sb]/4}\cdot w[sb]\cdot\sum_{i=l[sb]}^{l[sb+1]-1} xr_i\cdot y_i^{4/3} \quad (3.12)$$

and $$a[sb] = 2^{-scale\_factor[sb]/2}\cdot w[sb]\cdot\sum_{i=l[sb]}^{l[sb+1]-1} y_i^{4/3} \quad (3.13)$$

As global_gain should be an integer, global_gain is chosen as one of the two nearest integers to formula (3.11) which has smaller weighted distortion.

At step 104, fix global_gain. Update the scale factors scalefac, scalfac_scale and subblock_gain (for short windows) or preflag (for other windows) to minimize the combined cost of weighted distortion and bit rate for transmitting the scale factors. As indicated from equation (3.9), $$s[sb] = \text{global\_gain} - 210 - \text{scale\_factor}[sb],$$

where global_gain has the value of 0 to 255, and scale_factor [sb] is equal to $$\text{scale\_factor}[sb] = 2\times(\text{scalefac}[sb] + \text{preflag}\cdot\text{pretab}[sb])\times(1+\text{scalefac\_scale}). \quad (3.14)$$

preflag is equal to 0 or 1. The value of pretab[sb] is typically fixed and is of the form as shown in Table 1.

TABLE 1

The value of pretab[sb] for long windows.

| | Sb | | | | | | | | | | |
|---|---|---|---|---|---|---|---|---|---|---|---|
| | 0 to 10 | 11 | 12 | 13 | 14 | 15 | 16 | 17 | 18 | 19 | 20 |
| Preflag = 0 | 0 | 0 | 0 | 0 | 0 | 0 | 0 | 0 | 0 | 0 | 0 |
| Pretab = 1 | 0 | 1 | 1 | 1 | 1 | 2 | 2 | 3 | 3 | 3 | 2 |

scalefac_scale is equal to 0 or 1.

The bit length of scalefac[sb] is determined by scalefac_compress, that is, scalefac_compress determines the number of bits used for the transmission of the scalefactors according to Table 2.

TABLE 2

The bit length for scalefac[sb]

| scalefac_compress | slen1 | slen2 |
|---|---|---|
| 0 | 0 | 0 |
| 1 | 0 | 1 |
| 2 | 0 | 2 |
| 3 | 0 | 3 |
| 4 | 3 | 0 |
| 5 | 1 | 1 |
| 6 | 1 | 2 |
| 7 | 1 | 3 |
| 8 | 2 | 1 |
| 9 | 2 | 2 |
| 10 | 2 | 3 |
| 11 | 3 | 1 |
| 12 | 3 | 2 |
| 13 | 3 | 3 |
| 14 | 4 | 2 |
| 15 | 4 | 3 |

As can be appreciated from Table 2, the bit length may be a first bit length for a first group of scale factor bands and the bit length may be a second bit length for a second group of scale factor bands. In Table 2 slen1 is the bit length of scalefac for each of scalefactor bands 0 to 10, and slen2 is the bit length of scalefac for each of scalefactor bands 11 to 20.

From the above, it can be observed that a direct search for the minimum combined cost requires the computation of encoding costs for all combinations of scalefac_compress, scalfac_scale and preflag. This leads to 16×2×2=64 different combinations to find the minimum combined cost for each scalefactor band. Without intending to be limiting, the following example embodiment assumes that the encoding block is an MPEG-1 encoded, long-window frame. In some example embodiments, it is recognized that there are some redundant operations in the distortion computations. Therefore, some example embodiments provide for pre-generating a look-up table for those redundant operations, which are based on slen rather than searching through all combinations of scalefac_compress.

From Table 2, the maximum length for slen1 is 4 while the maximum length for slen2 is 3 (as based on the MP3 standard). When slen1 and slen2 are given, in some example embodiments, one can find the minimum encoding distortion for each scalefactor band and the corresponding scalefac[sb] which generates the minimum encoding distortion. Hence, when preflag and scalfac_scale are fixed, there only needs to be calculated 5 (the first 11 bands) or 4 (the last 10 bands) different cases of encoding distortion for each scale factor band, rather than calculate the encoding distortion 16 times for different scalefac compress. In each case, the pre-calculated encoding distortion is minimized with a certain value for scalefac[sb] given the length slen1 or slen2.

Let's denote dist[sb][slen] as the minimum weighted distortion for scale factor band sb, where sb=0, . . . , 20 and slen=0, . . . , 4. Denote sf[s][s][slen] as the value for scalefac [sb] such that the weighted distortion is minimized for scale factor band sb when the bit length used for transmitting scalefac[sb] is slen. To generate a look-up table for each scale factor band, apply the following approach given the fixed values for global_gain, scalfac_scale and preflag. Without loss of generality, the following example embodiment considers the first 11 scale factor bands for an MPEG-1 encoded, long-window frame.

Assume s[sb] in equation (3.9) can be freely chosen. That is, s[sb] is not restricted by the value of scalefac[sb] to be one of the 16 integer numbers (0, 1, 2, 3, 4, 5, 6, 7, 8, 9, 10, 11, 12, 13, 14, 15). Apply the minimum mean square error criterion to find the minimum weighted distortion for (3.9). That is, let $$\frac{\partial d_w[sb]}{\partial s[sb]} = 0,$$

which leads to $$s[sb] = \frac{4}{\log_{10} 2} \log_{10} \frac{\sum_{i=l[sb]}^{l[sb+1]-1} xr_i \cdot y_i^{4/3}}{\sum_{i=l[sb]}^{l[sb+1]-1} y_i^{8/3}} \quad (3.15)$$

Denote sg[sb]=s[sb]+210. The corresponding value for scalefac[sb] is $(\text{global\_gain}-sg[sb])/2^{(1+scalefac\_scale)}-$ preflag·pretab[sb]. Denote this value as T. scalefac[sb] cannot be freely chosen in reality (as defined by the standard), that is, it must be constrained to one of the 16 integer numbers (0, 1, 2, 3, 4, 5, 6, 7, 8, 9, 10, 11, 12, 13, 14, 15). In some example embodiments, the value of scalefac[sb] can be determined using the following algorithm. Generally, it is determined whether T exceeds encoding within slen, and if so constraining T to within slen:

```
If slen=0
    let sf[sb][slen] = 0, and calculate the distortion dist[sb][0].    (3.16)
Else (slen≠0)
    if T ≦ 0
        for slen = 1 to 4
            let sf[sb][slen] = 0, and let dist[sb][slen] = dist[sb][0].
    else if T ≧ 15
        for slen=1 to 4
            let sf[sb][slen]=2^slen−1, and calculate dist[sb][slen] using
            equation (3.9).
    else
        let sf[sb][4]=T (If T is not an integer, choose one of the two
        nearest integers to T which has smaller weighted distortion),
        calculate dist[sb][4] using equation (3.9)
        for slen=3 down to 1
            if sf[sb][slen+1] ≧ 2^slen−1
                let sf[sb][slen]=2^slen−1.
            else
                let sf[sb][slen]=sf[sb][slen+1].
                calculate dist[sb][slen] using equation (3.9).
```

Totally there are 20 different cases (5 slen1×2 preflag×2 scalfac_scale) of encoding distortion for each of the first 11 scale factor bands and 16 different cases (4 slen2×2 preflag×2 scalfac_scale) of encoding distortion for each of the last 10 scale factor bands. As the setting of preflag only affects the last 10 scale factor bands, the number of different cases of encoding distortion to be computed for each of the first 11 scale factor bands is reduced to 10 (5 slen1×2 scalfac_scale). In other words, the cost function is minimized with respect to preflag for only one set of scale factor bands, being the higher frequency scale factor bands 11 to 20. In addition, there exists one redundant case for each scale factor band if scalefac[sb] is equal to 0 (i.e., (3.16) may be calculated once). As a result, in some example embodiments, there are 9 (the first 11 scale factor bands) or 15 (the last 10 scale factor bands) different cases of encoding distortion for each scale factor band.

After generating the above table based on encoding distortion, what remains is the calculation of the total Lagrangian cost by calculating (3.3). As described above with respect to (3.3), the total Lagrangian cost is the addition of the encoding distortion and the bit rate. Therefore, what remains is the addition of bit rate to calculate the combined cost. For example, the distortion based on bit rate for the transmission of all scale factors can also be looked up from a pre-generated table, as is known in the art. Similarly, for other window cases, a similar approach could be applied to reduce the computational complexity.

At step 106, repeat steps 102 and 104 until the decrease of the combined cost is below a prescribed threshold. If the predetermined threshold is reached, at step 110 output the final global_gain and scale factors (scalefac, scalfac_scale, preflag/subblock_gain), and then ends at step 112 (or proceed to the next step in method 50 (FIG. 2)).

As the iterative method 100 generally converges after two rounds of iteration, the number of different cases to be computed for each scale factor band of an MPEG-1 encoded, long-window frame has been reduced from 16384 to 18 (the first 11 bands) or 30 (the last 10 bands).

The particular quantization factors or scale factors to be determined may depend on the particular application or coding scheme, and may not be limited to the parameters global_gain, scalefac, scalfac_scale, and preflag/subblock_gain.

Referring now to FIG. 2, step 60 will now be described. Given Huffman coding region division P, the quantization factors q and quantized spectral coefficients y, determining the Huffman codebook H may be performed as follows: for each region, every Huffman codebook that has encodable value limit larger than or equal to the greatest coefficient amplitude of that region is considered, and the one with the minimum codeword length is selected.

Implementation and simulation results will now be described. In regards to (3.3), the estimation of lambda (λ) will now be described in greater detail. In conventional systems, bisection methods may be used to determine for a final λ. This may require a high computational complexity which is proportional to the number of iterations over the optimization algorithm described in the last section. As recognized herein, in some example embodiments, by analyzing the relationship between Perceptual Entropy, signal to noise ratio, signal to mask ratio, encoding bit rate and the number of audio samples to be encoded, the final λ was estimated using the following formula in a trellis search algorithm for the optimization of advance audio coding (AAC), $$\lambda_{final}^{R} = \frac{c_1 \ln 10}{10M} \times 10^{(c_2 PE - c_3 R)/M} \quad (4.1)$$

where PE is Perceptual Entropy of an encoded frame, R is the encoding bit rate, and M is the number of audio samples to be encoded. $c_1$, $c_2$ and $c_3$ are determined from the experimental data using the least square criterion. This is for example generally described in C. Bauer and M. Vinton, "Joint optimization of scale factors and Huffman codebooks for MEPG-4 AAC," in *Proc. of the* 2004 *IEEE workshop on Multimedia Signal Processing*, pp. 111-114, 2004; and C. Bauer and M. Vinton, "Joint optimization of scale factors and Huffman codebooks for MEPG-4 AAC," in *IEEE Trans. on*

*Signal Processing*, vol. 54, pp. 177-189, January 2006, both of which are incorporated herein by reference.

In the experiment, 16 RIFF WAVE files with a sampling rate of 44.1 khz from a sound test file were used. The initial value for λ was arbitrarily selected, and the bisection method was used to find the final value for λ. The optimized MP3 encoded files were generated for each of the 16 RIFF WAVE test files at the encoding bit rates of 32, 40, 48, 56, 64, 80, 96, 112, 128, 144, 160, 192, 224, 256 and 320 kbps. For each tested file, tested values of Perceptual Entropy and λ at different encoding bit rates were recorded. As the values of Perceptual Entropy are usually in the range of 100 to 3000, tested data outside this range was discarded. Next, the values of tested Perceptual Entropy were uniformly quantized with a quantization step size of 100, and the mean value and standard deviation for the tested λ were calculated for each possible encoding bit rate and perceptual entropy pair.

To determine the values of $c_1$, $c_2$ and $c_3$, a non-linear regression progress within MATLAB optimization toolbox was used in some example simulations. Specifically, use the following MATLAB function $$\text{beta}=nlinfit(X,y,\text{fun},\text{beta0}) \tag{4.2}$$

to estimate the coefficients of $c_1$, $c_2$ and $c_3$. In the above formula, X represents independent variables PE and R. y represents the dependent variable $\lambda_{final}^R$, fun represents the formula (4.1). beta0 is a vector containing initial values for the coefficients for $c_1$, $c_2$ and $c_3$. To avoid the ill condition in the nonlinear regression process, discard those encoding bit rate and perceptual entropy pairs where 75% of the tested $\lambda_{final}^R$ values generated from the bisection method fall outside the range of ±20% of standard deviation from the mean value.

For 44.1 khz sampling audio, LAME's psychoacoustic model, the following values for $c_1$, $c_2$ and $c_3$ to encode the audio file in MP3 format were obtained:

$$\begin{cases} c_1 = 8.3839 \\ c_2 = 1.3946 \\ c_3 = 6.2698 \end{cases}$$

The average number of iterations was tested over the Lagrangian multiplier if the formula (4.1) with the above estimated coefficient is used as the initial point for the bisection search. The average number of iterations over the Lagrangian multiplier is 1.5. On the other hand, the average number of iterations over the Lagrangian multiplier ranges from 4 to 8 if an arbitrary number is used as the initial point. Therefore, on the average, using (4.1) as the initial point can run 4 times as fast as the method in which an arbitrary initial point is used.

Figure 6:
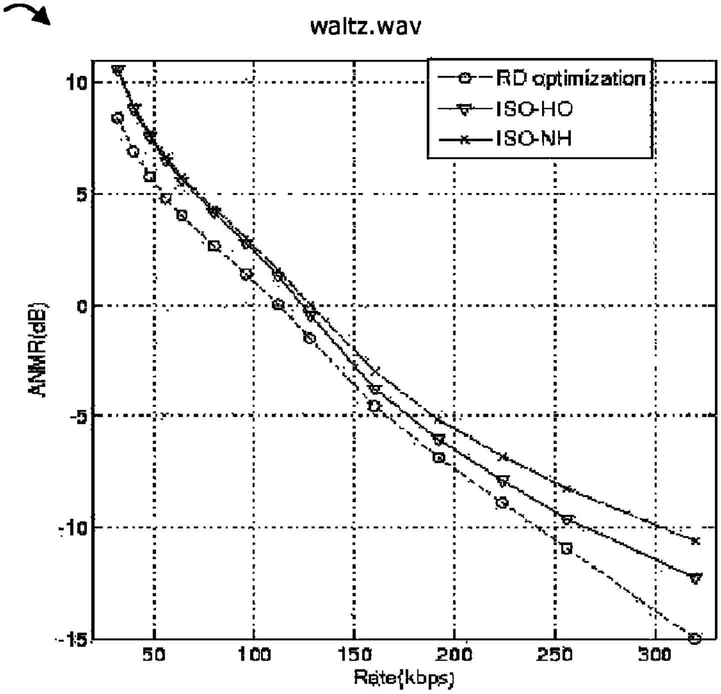
FIG. 6 shows a graph of performance characteristics of an example embodiment, for encoding of audio file waltz.wav as compared to ISO reference codec.
Figure 7:
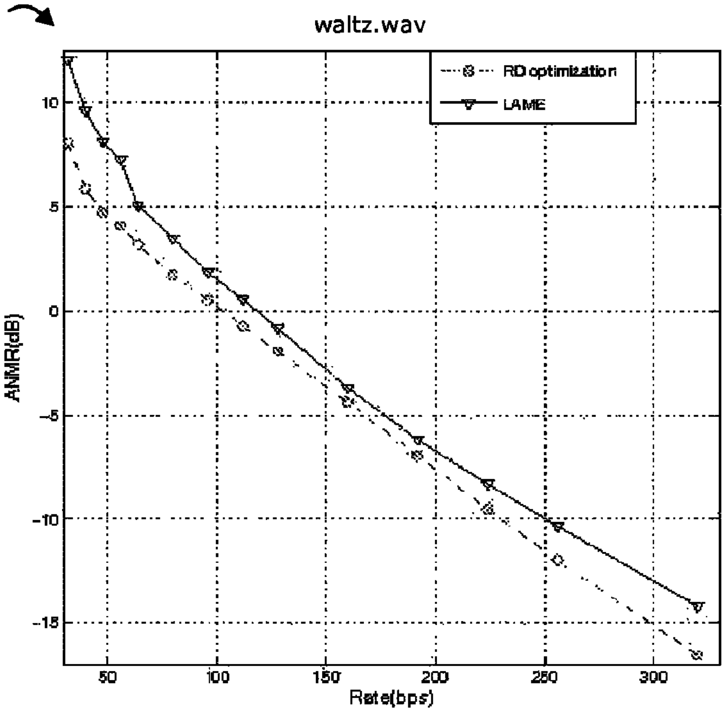
FIG. 7 shows a graph of performance characteristics of an example embodiment, for encoding of audio file waltz.wav as compared to LAME.
Figure 8:
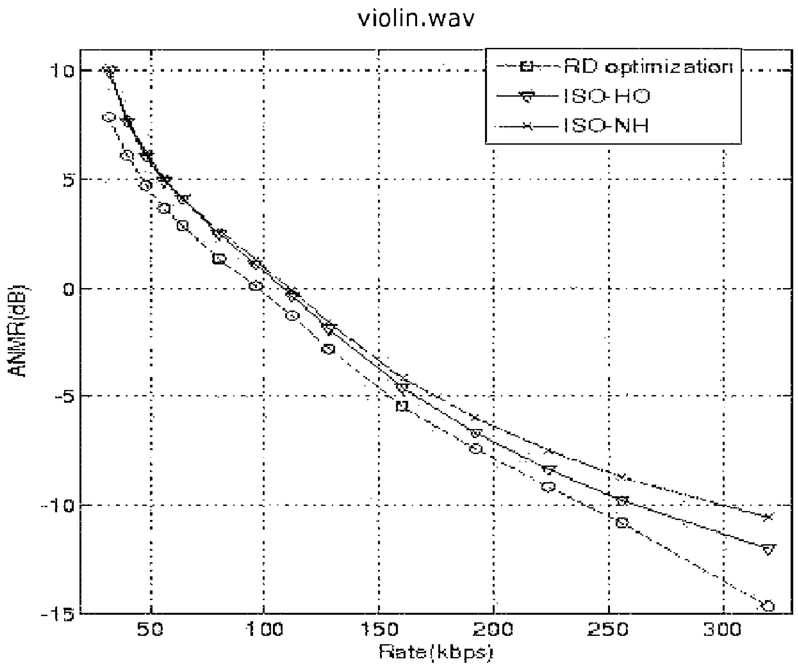
FIG. 8 shows a graph of performance characteristics of an example embodiment, for encoding of audio file vioin.wav as compared to ISO reference codec.
Figure 9:
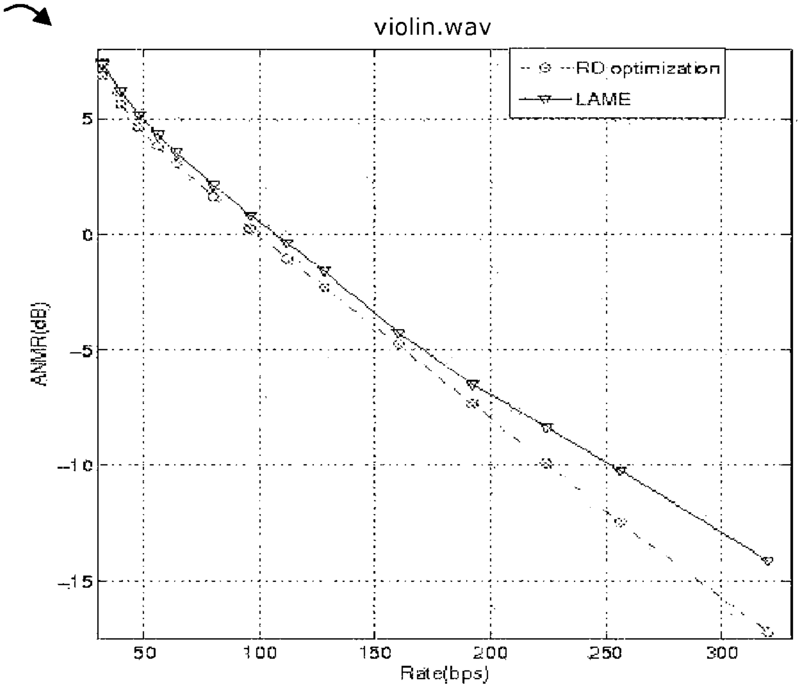
FIG. 9 shows a graph of performance characteristics of an example embodiment, for encoding of audio file violin.wav as compared to LAME.

Implementation and simulation results of the optimization process 50 will now be described, referring now to FIGS. 6 to 9. Generally, the performance of example embodiments is implemented based on two MP3 encoders: ISO reference codec and LAME 3.96.1. For each case, the iterative optimization algorithm uses the original encoder output as the initial points. FIG. 6 shows a graph 140 of performance characteristics of an example embodiment, showing a comparison of the method 50 (FIG. 2) for encoding of audio file waltz.wav as compared to ISO reference codec. FIG. 7 shows a graph 150 of performance characteristics of an example embodiment, for encoding of audio file waltz.wav as compared to LAME. FIG. 8 shows a graph 160 of performance characteristics of an example embodiment, for encoding of audio file vioin.wav as compared to ISO reference codec. FIG. 9 shows a graph 170 of performance characteristics of an example embodiment, for encoding of audio file violin.wav as compared to LAME.

The LAME MP3 encoder features a psychoacoustic model, joint stereo encoding and variable bit-rate encoding. However, LAME still uses the basic structure of typical TNLS. In LAME 3.96.1, a refining TNLS is used to minimize the total noise to masking ratio for an entire frame after the successful termination of search process given its typical TNLS. Specifically, during each outer loop, the band with maximum noise to masking ratio is amplified and the best result based on total noise to mask ratio is stored.

The method 50 (FIG. 2) is implemented as described above. For each case, the perceptual model, joint stereo encoding mode and window switching decision are kept intact. FIG. 6 shows the rate-distortion performance of the method 50 (FIG. 2) (denoted as "RD optimization" in the graph 140) applied to ISO reference encoder, when compared to a conventional or normal ISO reference encoder implementing TNLS, in constant bit-rate mode for waltz.wav. The test file may for example be encoded at 48 khz, 2 channel, 16 bits/sample, 30 seconds. In FIG. 6, "ISO-HO" represents the optimal Huffman tables used for Huffman coding, while "ISO-NH" means that the first Huffman table satisfying the coding limit is selected for each Huffman coding region. The vertical axes denote the average noise to mask ratio over all audio frames. From FIG. 6, the method 50 (FIG. 2) can achieve significant performance gain over the ISO reference encoder. For instance, at 320 kbps the proposed optimization algorithm achieves 4.57 dB and 2.75 dB ANMR gains over ISO-NH and ISO-HO respectively. The ANMR of the optimized algorithm at 32 kbps is similar to that of ISO reference encoder at 40 kbps, which corresponds to equivalent 20% compression rate reduction.

FIG. 7 depicts the rate-distortion performance of the method 50 (FIG. 2) (also denoted as "RD optimization) applied to LAME when compared to the LAME reference encoder (implementing conventional TNLS) in constant bit-rate mode for waltz.wav. It is shown separately from ISO reference encoder because ISO reference encoder and LAME adopt different perceptual models. For an unbiased comparison, in some example embodiments the LAME encoder disables the functions of amplitude scaling and low pass filter. In FIG. 7, "LAME" means that the audio file is compressed using LAME's normal compression mode. As shown, the method 50 (FIG. 2) outperforms LAME in terms of compression performance. At 96 kbps, the proposed optimization algorithm achieves about 1.34 dB ANMR gain over LAME.

FIGS. 8 and 9 compare the compression performance of the method 50 (FIG. 2) for the music file violin.wav (MPEG lossless audio coding test file, 48 khz, 2 channel, 16 bits/sample, 30 seconds) in constant bit-rate mode. FIG. 8 shows results from ISO reference encoder, while FIG. 9 shows results from LAME. It may be observed that "RD optimization" has improved rate-distortion over the conventional reference encoders. Similar results may be observed for other test music files.

Referring now to FIG. 2, the computational complexity of the method 50 will now be described. Given the value of λ, the number of iterations in the iterative joint optimization algorithm has a direct impact on the computational complexity. Experiments show that by setting the convergence tolerance ϵ to 0.005, the iteration process is observed to converge after 2 loops in most cases, that is, most of the gain achievable from full joint optimization is obtained within two iterations. This is the same to the iterative quantization factor q updating in step 58. In Step 56, the search range for $y_j$ is set to $[yh_j-a, yh_j+a]$, where $yh_j$ is the jth quantized coefficient from hard decision quantization (e.g. $y_j$ is determined from (2.1)) and a is a fixed integer. Experiments show that further expansion of the search range for $y_j$ beyond a=2 does not significantly improve compression performance. In constant bit-rate mode, the average number of iterations over the Lagrangian multiplier is 1.5 if the formula (4.1) is used as the initial point. On the other hand, the average number of iterations over the Lagrangian multiplier ranges from 4 to 8 if an arbitrary number is used as the initial point.

Table 3 lists the computation time (in seconds) on a Pentium PC, 2.16 GHZ, 1 G bytes of RAM to encode violin.wav and waltz.wav at different transmission rates for the method 50 based on LAME reference codec.

TABLE 3

Computation time in seconds for different MP3 encoders

| | Bit rates (kbps) | | | | |
|---|---|---|---|---|---|
| | 96 | 112 | 128 | 160 | 192 |
| Waltz.wav | 27 | 23 | 21 | 21 | 16 |
| Violin.wav | 23 | 22 | 20 | 16 | 15 |

From Table 3 the proposed optimization algorithm generally reaches real time throughput, which suggests that the method 50 is computationally efficient. As shown in Table 3, the computation time is generally less than 30 seconds. The computation time for ISO-based encoders is not listed, but are generally less-efficient than LAME-based encoders in both the computation time and compression performance.

Figure 10:
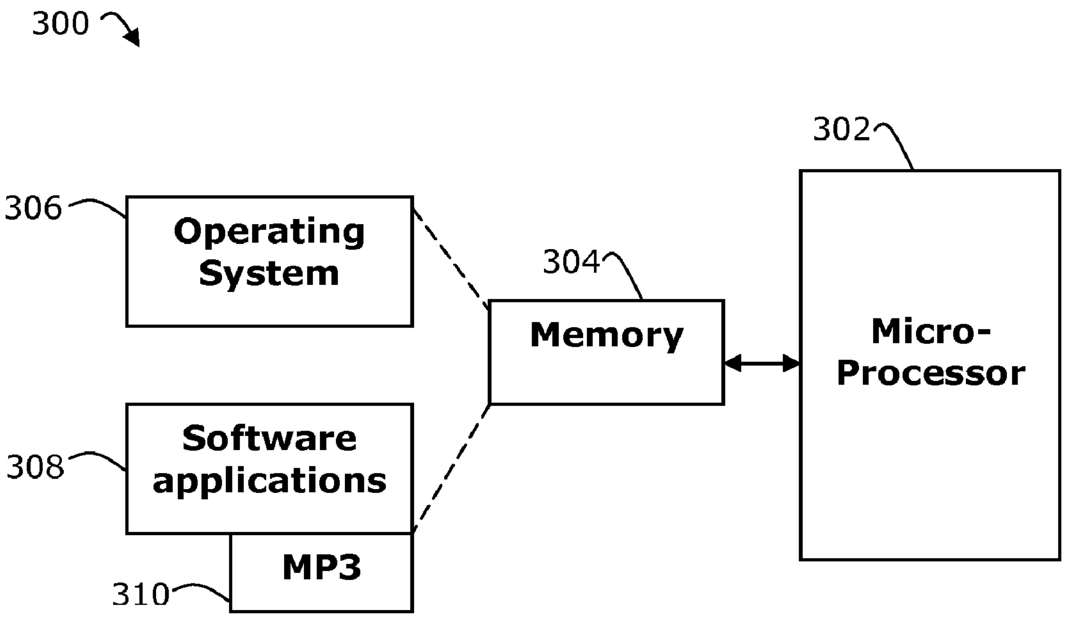
FIG. 10 shows an encoder for optimizing encoding performance of MP3 in accordance with an example embodiment.

Reference is now made to FIG. 10, which shows an encoder 300 in accordance with an example embodiment. The encoder 300 may for example be implemented on a suitable configured computer device. The encoder 300 includes a controller such as a microprocessor 302 that controls the overall operation of the encoder 300. The microprocessor 302 may also interact with other subsystems (not shown) such as a communications subsystem, display, and one or more auxiliary input/output (I/O) subsystems or devices. The encoder 300 includes a memory 304 accessible by the microprocessor 302. Operating system software 306 and various software applications 308 used by the microprocessor 302 are, in some example embodiments, stored in memory 304 or similar storage element. For example, MP3 software application 310, such as the ISO-based encoder or LAME-based encoder described above, may be installed as one of the various software applications 308. The microprocessor 302, in addition to its operating system functions, in example embodiments enables execution of software applications 308 on the device.

The encoder 300 may be used for optimizing performance of MP3 encoding of a source sequence. Specifically, the encoder 300 may enable the microprocessor 302 to determine quantization factors (for example including a global quantization step size and scale factors) for the source sequence. The memory 304 may contain a cost function of an encoding of the source sequence, wherein the cost function is dependent on the quantization factors. The memory 304 may also contain a predetermined tolerance of the cost function stored in the memory 304. Instructions residing in memory 304 enable the microprocessor 302 to access the cost function and predetermined tolerance from memory 304, determine the quantization factors which minimize the cost function within the predetermined tolerance, and store the determined quantization factors in memory 304 for MP3 encoding of the source sequence. Generally, an iterative method is performed such that global_gain is determined while the scale factors are fixed, and the scale factors are determined while global_gain is fixed. This is repeated until a calculated rate-distortion cost is within a predetermined threshold. For example, the MP3 software application 310 may be used to perform MP3 encoding using the determined quantization factors.

In another example embodiment, the encoder 300 may be configured for optimizing of parameters including quantization factors, in a manner similar to the example methods described above. For example, the encoder 300 may be configured to perform the method 50 (FIG. 2).

While the foregoing has been described with respect to MP3 encoding, it may be appreciated by those skilled in the art that example embodiments may be adapted to or implemented by other forms of signal encoding or audio signal encoding, for example Advanced Audio Coding.

While example embodiments have been described in detail in the foregoing specification, it will be understood by those skilled in the art that variations may be made without departing from the scope of the present application.

What is claimed is:

1. A method for optimizing audio encoding of a source sequence, the encoding being dependent on quantization factors, the quantization factors including a global quantization step size and scale factors, the method comprising:

defining a cost function of the encoding of the source sequence, the cost function being dependent on the quantization factors;

initializing fixed values of the scale factors; and determining, using a processor, values of the quantization factors which minimize the cost function by iteratively performing:

determining, for the fixed values of the scale factors, a value of the global quantization step size which minimizes the cost function, fixing the determined value of the global quantization step size and determining values of scale factors which minimize the cost function, and fixing the determined values of the scale factors, and determining whether the cost function is below a predetermined threshold, and if so ending the iteratively performing, wherein the scale factors are constrained within a bit length, and wherein the bit length is a first bit length for a first group of scale factor bands and the bit length is a second bit length for a second group of scale factor bands.

2. The method claimed in claim 1, wherein the cost function is based on a distortion of the encoding of the source sequence.

3. The method claimed in claim 2, wherein the cost function is further based on a rate, said rate being a transmission bit rate of the encoding of the source sequence.

4. The method claimed in claim 3, wherein the cost function is further based on a tradeoff function that represents a tradeoff of the rate for distortion.

5. The method claimed in claim 4, wherein, in the step of fixing the determined value of the global quantization step size and determining values of scale factors which minimize the cost function, the distortion is obtained from a pre-generated table.

6. The method claimed in claim 4, wherein the tradeoff function includes λ, the method further comprising:

calculating λ as:

$$\lambda_{final}^{R} = \frac{c_1 \ln 10}{10M} \times 10^{(c_2 PE - c_3 R)/M},$$

wherein PE is Perceptual Entropy of an encoded frame, R is the rate, M is a number of audio samples to be encoded, and $c_1$, $c_2$ and $c_3$ are constants; and calculating the cost function using λ.

7. The method claimed in claim 1, wherein the step of determining the value of the global quantization step size includes differentially calculating the cost function with respect to global quantization step size to determine the global quantization step size which minimizes the cost function.

8. The method claimed in claim 1, wherein the determining of the value of global quantization step size includes calculating:

$$\frac{4}{\log_{10}2}\log_{10}\frac{\sum_{sb=1}^{N} b[sb]}{\sum_{sb=1}^{N} a[sb]}+210$$

wherein $$b[sb]=2^{-scale\_factor[sb]/4}\cdot w[sb]\cdot\sum_{i=l[sb]}^{l[sb+1]-1} xr_i\cdot y_i^{4/3}$$

and $$a[sb]=2^{-scale\_factor[sb]/2}\cdot w[sb]\cdot\sum_{i=l[sb]}^{l[sb+1]-1} y_i^{4/3}$$

wherein $xr_i$ is the source sequence, scale_factor[sb] is a quantization step size for scale factor band sb, l[sb] and l[sb+1]−1 are start and end positions for scale factor band sb respectively, w[sb] is an inverse of the masking threshold for scale factor band sb, and $y_i$ is a quantized spectral coefficient of the source sequence.

9. The method claimed in claim 1, wherein the scale factors include a parameter scalefac being a scale factor for a particular scale factor band, the method further comprising:

calculating a value of scalefac which minimizes the cost function and constraining scalefac to within the bit length.

10. The method claimed in claim 9, wherein the step of calculating the value of scalefac includes differentially calculating the cost function with respect to scalefac to determine the value of scalefac which minimizes the cost function.

11. The method claimed in claim 9, wherein the step of calculating the value of scalefac includes calculating:

$$\frac{4}{\log_{10}2}\log_{10}\frac{\sum_{i=l[sb]}^{l[sb+1]-1} xr_i\cdot y_i^{4/3}}{\sum_{i=l[sb]}^{l[sb+1]-1} y_i^{8/3}}$$

wherein $xr_i$ is the source sequence, l[sb] and l[sb+1]−1 are start and end positions for scale factor band sb respectively and $y_i$ is a quantized spectral coefficient of the source sequence.

12. The method claimed in claim 1, wherein the scale factors include a high frequency amplification parameter.

13. The method claimed in claim 1, wherein the audio encoding is MPEG I/II Layer-3 encoding.

14. The method claimed in claim 1, wherein the encoding is further dependent on quantized spectral coefficients, Huffman codebooks, and Huffman coding region partition, the method further including minimizing the cost function with respect to the quantized spectral coefficients, the Huffman codebooks, and the Huffman coding region partition.

15. An encoder for optimizing audio encoding of a source sequence, the audio encoding being dependent on quantization factors, the quantization factors including a global quantization step size and scale factors, the encoder comprising:

a controller;

a memory accessible by the controller, a cost function of the encoding of the source sequence stored in memory, the cost function being dependent on the quantization factors; and a predetermined threshold of the cost function stored in the memory, wherein the controller is configured to:

access the cost function and predetermined threshold from memory, initialize fixed values of the scale factors, and determine values of the quantization factors which minimize the cost function by iteratively performing:

determining, for the fixed values of the scale factors, a value of the global quantization step size which minimizes the cost function, fixing the determined value of the global quantization step size and determining values of scale factors which minimize the cost function, and fixing the determined values of the scale factors, and determining whether the cost function is below the predetermined threshold, and if so ending the iteratively performing, wherein the scale factors are constrained within a bit length, and wherein the bit length is a first bit length for a first group of scale factor bands and the bit length is a second bit length for a second group of scale factor bands.

* * * * *